United States Patent [19]

Carlson et al.

[11] Patent Number: 5,019,787
[45] Date of Patent: May 28, 1991

[54] OPTICAL AMPLIFIER

[75] Inventors: Nils W. Carlson, Lawrence Township, Mercer County; Gary A. Evans, West Windsor Township, Mercer County; Jacob M. Hammer, Princeton Borough, Mercer County; Michael Ettenberg, West Windsor Township, Mercer County, all of N.J.

[73] Assignee: David Sarnoff Research Center, Inc., Princeton, N.J.

[21] Appl. No.: 428,695

[22] Filed: Oct. 30, 1989

[51] Int. Cl.$^5$ .................. H01S 3/19; H01L 33/00
[52] U.S. Cl. ..................... 330/4.3; 455/610; 455/612; 372/50
[58] Field of Search ............... 330/4.3; 372/45, 46, 372/50; 455/610, 612

[56] References Cited

U.S. PATENT DOCUMENTS

| | | | |
|---|---|---|---|
| 3,484,713 | 12/1969 | Fenner | 330/4.3 |
| 3,887,876 | 6/1975 | Zeidler | 330/4.3 |
| 4,194,162 | 3/1980 | Uematsu et al. | 330/4.3 |
| 4,376,307 | 3/1983 | Rozzi et al. | 372/45 |
| 4,380,074 | 4/1983 | Walsh | 330/4.3 |
| 4,794,346 | 12/1988 | Miller | 372/50 |
| 4,794,607 | 12/1988 | Devlin | 372/49 |
| 4,881,236 | 11/1989 | Brueck et al. | 372/45 |
| 4,942,366 | 7/1990 | Toda | 330/4.3 |

OTHER PUBLICATIONS

Hammer et al.; "Phase-Locked Operation . . . Diode Lasers"; Appl. Phys. Lett., vol. 50, #11, 3/16/87.
Carlson et al.; "Electronic Beam Steering . . . Laser Arrays"; Appl. Phys. Lett.; vol. 53, #23, 12/5/88, pp. 2275-2277.
Evans et al.; "Two-Dimensional Coherent . . . Surface Emission"; IEEE J. Q. E., vol. 25, #6, 6/89, pp. 1525-1538.
Carlson et al.; "High Speed Swtiching . . . Diode Lasers"; J. Lightwave Tech., 12th Conf. Opt. Filter Commun., 2/9/89; abst. only.
"Quantum Well Lasers-Gain, Spectra, Dynamics", by Y. Arakawa, IEEE Journal of Quantum Electronics, vol. QE-22, No. 9, Sep., (1986), pp. 1887-1899.
"Focused-Ion-Beam Micromachined AlGaAs Semiconductor Laser Mirrors", by J. Puretz, et al., Electronics Letters, vol. 22, (1986), pp. 700-702.
"Analysis of Grating-Coupled Radiation in GaAs:-GaAlAs Lasers & Waveguides-II: Blazing Effects", by W. Streifer, et al., IEEE Journal of Quantum Electronics, vol. QE-12, Aug. (1976), pp. 494-499.

Primary Examiner—Nelson Moskowitz
Attorney, Agent, or Firm—W. J. Burke

[57] ABSTRACT

An optical amplifier comprising a substrate of a semiconductor material having a pair of opposed surfaces and a body of semiconductor material on one of the surfaces. The body includes a pair of clad layers of opposite conductivity types having an intermediate quantum wall region therebetween. The clad layers are of a semiconductor material which form a heterojunction with the material of the quantum well region. The clad layers and quantum well region forms a waveguide which extends along the body. A gain section is in the body along the waveguide. The gain section includes a capping layer over the outermost clad layer, a contact on the capping layer and a contact on the other surface of the substrate to allow a voltage to be applied across the gain section. The gain section is adapted to generate light in the active region when a voltage is applied thereacross. A light input section having a grating extending across the body is at one end of the gain section. The light input section is adapted to direct light into the body and along the waveguide. A light output section having a grating extending across the body is at the other end of the gain section. The light output section is adapted to direct the amplified light from the gain section out of the body. The periods of the gratings are such that no self-oscillation of the light in the waveguide occurs.

18 Claims, 2 Drawing Sheets

OPTICAL AMPLIFIER

FIELD OF THE INVENTION

The present invention relates to an optical amplifier, and, more particularly, to a monolithic grating surface-emitting optical amplifier.

BACKGROUND OF THE INVENTION

Optical communication systems, in general, include means for generating a modulated beam of light, means for transmitting the beam of light over a long distance, means for receiving the beam of light and means for converting the received beam of light to an electrical signal. When the beam of light is to be transmitted over a long distance, it is often necessary to periodically amplify the beam. In communication systems that use optical fibers for transmitting the beam, it is only necessary to periodically couple the optical fiber into an amplifier. However, for communication systems in which the beam is transmitted through free space, the amplifier must not only be capable of amplifying the beam of light, but must also have the capabilities of receiving the beam of light from free space and of re-transmitting the amplified beam into free space.

SUMMARY OF THE INVENTION

An optical amplifier includes a body of a semiconductor material having means for receiving a beam of light and directing the beam along a path in the body. A gain section is provided along the beam path through the body which is capable of amplifying the beam. The body also includes means for receiving the amplified beam from the gain section and directing the amplified beam out of the body. All feed-back in the body is suppressed so that laser oscillation does not occur and the amplifier provides only a single-pass gain.

DETAILED DESCRIPTION

Figure 1:
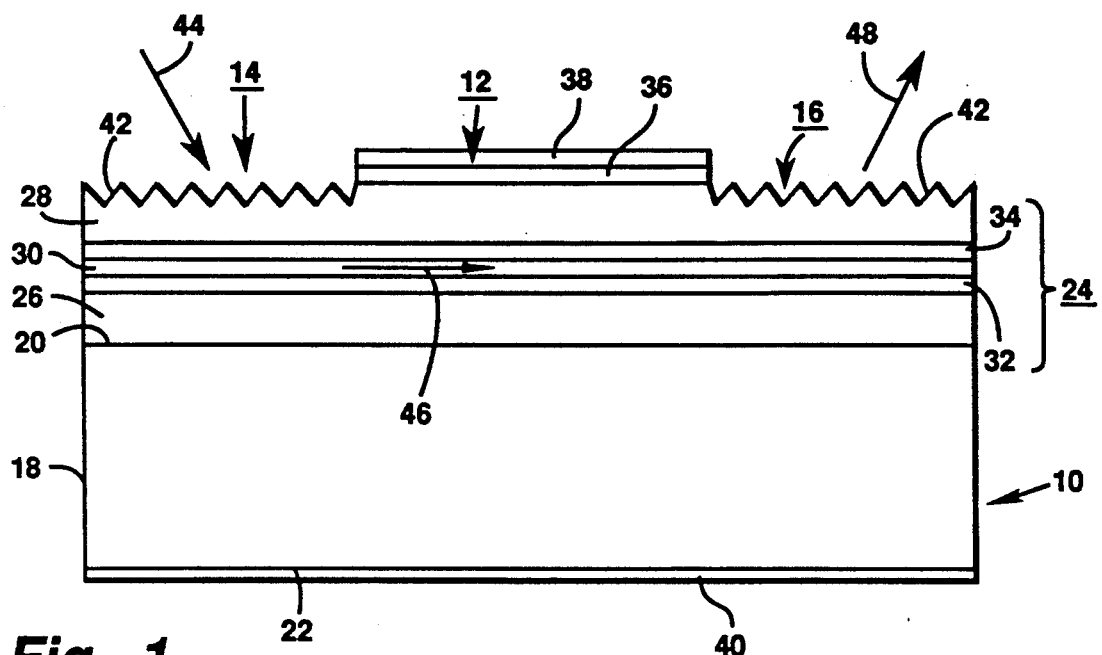
FIG. 1 is a sectional view of one form of the optical amplifier of the present invention.

Referring to FIG. 1, there is shown an optical amplifier 10 of the present invention which includes a gain section 12, a light input section 14 at one end of the gain section 12, and a light output section 16 at the other end of the gain section 12. The optical amplifier 10 includes a substrate 18 of a semiconductor material having first and second opposed surfaces 20 and 22.

On the first surface 20 of the substrate 18 is a waveguide 24. The waveguide 24 shown comprises a pair of clad layers 26 and 28 of a semiconductor material with the clad layers 26 and 28 being of opposite conductivity types. Thus, if the clad layer 26 is of N-type conductivity, the clad layer 28 is of P-type conductivity. Between the two clad layers 26 and 28 is a thin intermediate quantum well layer 30 of a semiconductor material which is undoped. The quantum well layer 30 can be either a single quantum well or a multiple quantum well. A description of quantum well layers can be found in the article of Y. Arakawa entitled "Quantum Well Lasers-Gain, Spectra, Dynamics", published in IEEE JOURNAL OF QUANTUM ELECTRONICS, vol QE-22, No. 9, Sept. 1986, pgs. 1887-1986. The clad layers 26 and 28 are of a material having an energy band-gap higher than that of the material of the quantum well layer 30 so as to achieve both charge carrier and light confinement within the quantum well layer 30 and to form a heterojunction with the material of the quantum well region. For example, the clad layers 26 and 28 may be of AlGaAs wherein the mole fraction of AlAs is about 70% ($Al_{0.7}Ga_{0.3}As$), and the quantum well layer 30 may be of GaAs.

Between the quantum well layer 30 and each of the clad layers 26 and 28 is a confinement layer, 32 and 34 respectively, each of which is of the same conductivity type as its adjacent clad layer. The confinement layers 32 and 34 are typically composed of AlGaAs and may be graded so that the mole fraction of AlAs varies from that of the clad layers 26 and 28 at the clad layers to about one-half of that in the clad layers 20 and 22 at the quantum well layer 30. Thus the composition of the graded confinement layers 32 and 34 would vary from $Al_{0.7}Ga_{0.3}$. As at the clad layers 26 and 28 to $Al_{0.3}Ga_{0.7}$. As at the quantum well layer 30. However, the confinement layers 32 and 34 may be of uniform composition having an energy band-gap between that of the materials of the clad layers 26 and 28 and the quantum well layer 30, such as $Al_{0.3}Ga_{0.7}As$.

In the gain section 12, a capping layer 36 is over the outermost clad layer 28. The capping layer 36 is of a semiconductor material of the same conductivity type as that of the clad layer 28, i.e. P-type conductivity. The capping layer 36 is preferably of GaAs. The substrate 18 is of a conductivity type the same as that of the clad layer 26, i.e. N-type conductivity. The substrate 12 can be of any semiconductor material on which the waveguide 24 can be formed, such as GaAs. Typically, the clad layers 26 and 28 are of a thickness of about 1.2 micrometers ($\mu m$), the quantum well layer is of a thickness of about 50 to 100 Angstroms (Å), the confinement layers 32 and 34 are of a thickness of about 0.2 to 0.4 $\mu m$, and the capping layer 36 is of a thickness of about 0.2 $\mu m$. A contact layer 38 of a conductive material is on and makes ohmic contact with the capping layer 36. A contact layer 40 of a conductive material is on and makes ohmic contact with the second surface 20 of the substrate 18. The contacts 38 and 40 allow a voltage to be applied across the gain section 12.

In each of the light input and output sections 14 and 16, respectively, a grating 42 is provided in the surface of the outermost clad layer 28. As shown, the grating 42 is formed by a plurality of parallel V-shaped grooves 43 extending transversely across the clad layer to the direction of light propagation 28. However, the grating 42 may be of any well known type. The grating period is selected so that monochromatic light, which is within the gain bandwidth of the gain section 12, that is externally incident at a specific angle on the light input section 14, as indicated by the arrow 44, will be coupled into a running wave in the fundamental mode of the waveguide 24 and will propagate toward the gain section 12 as indicated by the arrow 46. After the light passes through the gain section 12 into the light output section 16, the grating period in the light output section 16 causes the light to pass out of the light output section 16 at an angle equal to the incident angle as indicated by the arrow 48. However, in order to prevent self-oscillation in the gain section 12, it is necessary that (1) the grating period be such that the Bragg condition is not satisfied for any wavelength with the gain section 12, and/or (2) that the second or any higher grating order not be coupled to the fundamental mode of the waveguide 24.

The range of grating periods which will satisfy the above conditions is rather large. The following is an example for determining a suitable grating period. The second order diffraction order angle $\Theta_2$ and the first diffracted grating order angle $\Theta_1$ can be determined by the following formulae where both angles are measured with respect to the grating normal:

$$\Theta_1 = \sin^{-1}(1/n_0)[\lambda/\Lambda) - n_e] \downarrow_2 = \sin^{-1}(1/n_0)[(2\lambda/\Lambda) - n_e]$$

where $n_e$ is the effective refractive index of the waveguide, $n_0$ is the refractive index of the medium into which the light is coupled, $\Lambda$ is the grating period, and $\lambda$ is the wavelength of light in free space. For waveguides formed of GaAs/AlGaAs, the wavelength of light is 8500 Å and the effective index $n_e$ of the waveguide is 3.4 Assuming that the amplifier 10 is to be designed so that the 8500 Å light is incident on the grating 42 at an angle $\Theta_1$ of 45°, then from the above equations the grating period $\Lambda$ would be 3100 Å and the second diffracted grating order angle $\Theta_2$ would be 42°. For a grating period of 3100 Å, the Bragg condition is satisfied only for wavelengths in the neighborhood of 1.5 μm, which is well outside the gain bandwidth of GaAs/AlGaAs devices. Also, since the second diffraction order angle $\Theta_2$ is greater than 16° but less than 75°, the second diffraction order of the grating is not coupled into the fundamental mode of the waveguide or into the air, but is all coupled into substrate modes. Although this is a loss, it can be minimized by blazing the grating coupler so that most of the light is coupled into the first order. Blazing can be achieved as described in the article of W. Streifer et al, entitled "Analysis of Grating-Coupled Radiation in GaAs:GaAlAs Lasers And Waveguides-II: Blazing Effects", published in IEEE JOURNAL OF QUANTUM ELECTRONICS, Vol. QE-12, Aug., 1976, pages 494–499. Also, $\Lambda$ could be selected such that there is not angle that satisfies the second order condition. For example, if $\Lambda = 2300$ Å, there is no real $\Theta_2$, and the Bragg condition occurs at $\lambda = 7800$ Å, which is outside the gain profile.

In the operation of the amplifier 10, light is directed into the input section 14 as indicated by the arrow 44. As stated above, the period of the grating 42 in the input section 14 is such that the light is directed along the waveguide 24 into the gain section 14. A voltage is applied across the gain section 14 which is above the threshold of the gain section 12 to cause light to be generated in the gain section 12. The light passing through the gain section 12 results in the generation of additional light by stimulated emission resulting in the amplification of the light passing through the gain section 12. The amplified light then passes into the output section 16 where the grating 42 causes the light to be directed out of the output section 16 as indicated by the arrow 48. Thus, the amplifier 10 receives light from space, amplifies it and passes the amplified light back out into space. To optimize the single pass gain of the amplifier 10, it is preferred to use a multiquantum well active structure in the waveguide 24 rather than a single quantum well structure. However, in order to overcome the relatively low coupling efficiencies of the gratings 42 of the input and output sections 14 and 16, the amplifier 10 can be provided with a plurality of the gain sections 12 which are cascaded together through grating sections.

Figure 2:
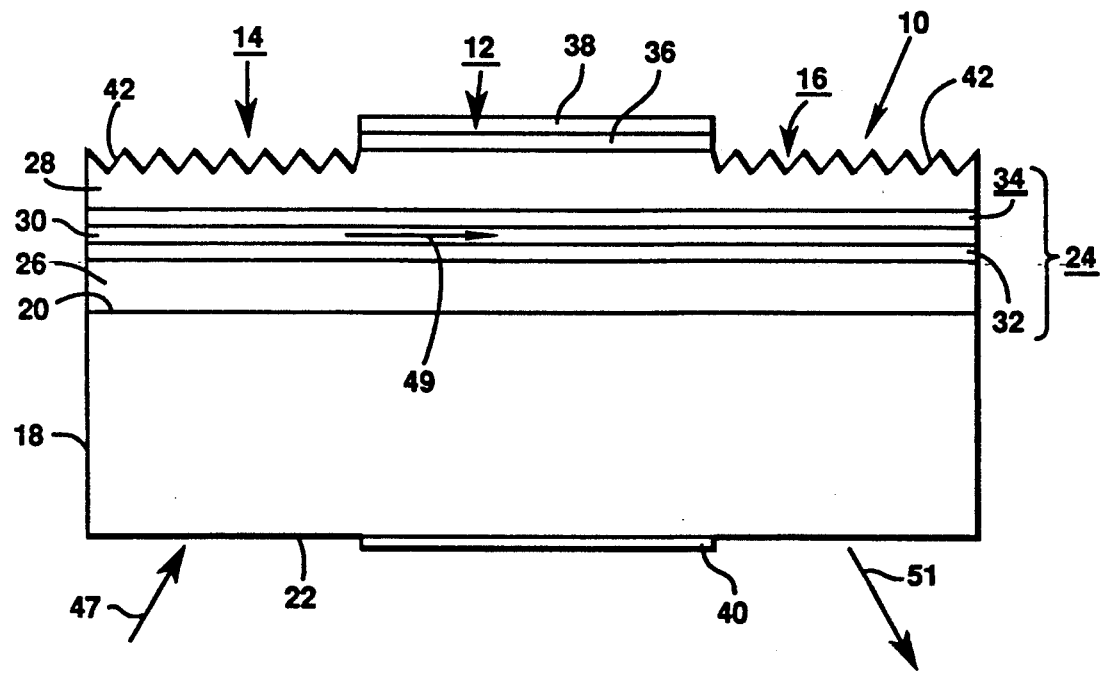
FIG. 2 is a view similar to FIG. 1 showing a modification of the mounting of the optical amplifier of the present invention.

Referring to FIG. 2, there is shown the amplifier 10 with the light being directed into the light input section 14 through the surface 22 of the substrate 18 as indicated by the arrow 47. The light passes through the substrate 18 and the waveguide 24 to the grating 42. The grating deflects the light into the waveguide 24 at an angle to cause the light to pass along the waveguide 24 as indicated by the arrow 49. The light passing through the gain section 12 results in an amplification of the light as previously described. The amplified light then passes into the light output section 16 where the grating 42 causes the light to be directed out of the amplifier 10 through the substrate 18 as indicated by the arrow 51.

The amplifier 10 can be made by epitaxially depositing on the surface 20 of a substrate 18 the clad layer 26, confinement layer 32, quantum well layer or layers 30, confinement layer 34, clad layer 28 and capping layer 36 in succession. This can be done by any well known technique for epitaxially depositing the material of the layers, such as liquid phase or vapor phase epitaxy. A masking layer, such as of a photoresist, is formed over the portion of the capping layer 36 where the gain section 12 is to be formed, and the remaining portion of the capping layer 36 is removed with a suitable etchant. The grooves 43 of the gratings 42 are then etched into the exposed surface of the clad layer 28 at each side of the gain section 12. The metal contacts 38 and 40 are then applied to the capping layer 36 and substrate surface 22, by techniques such as evaporation in a vacuum or by sputtering.

Figure 3:
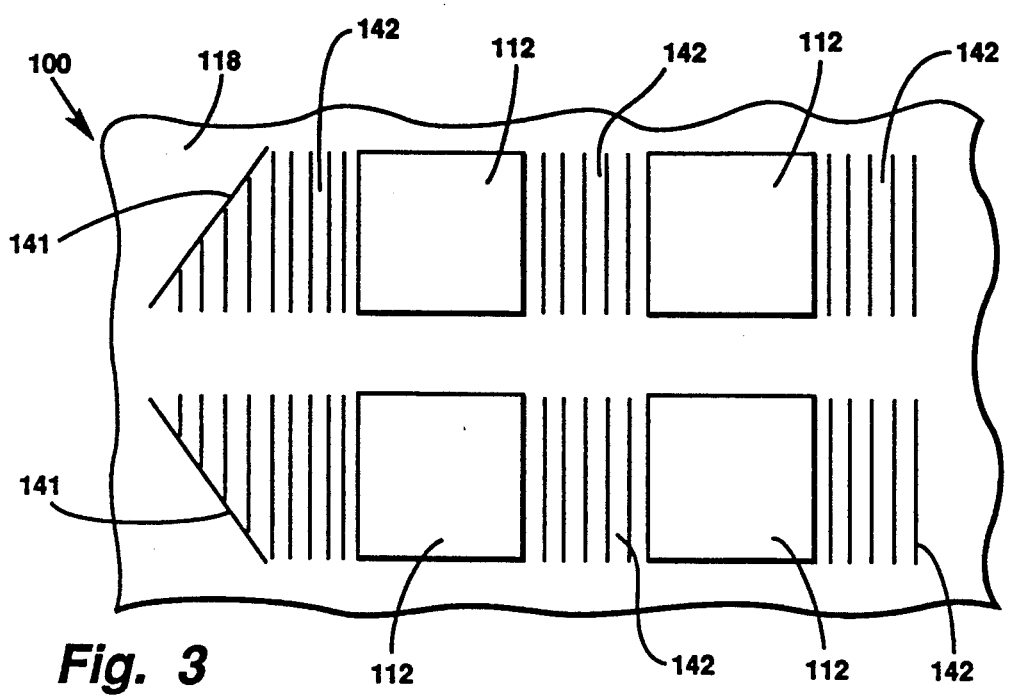
FIG. 3 is a top schematic view of an array of the optical amplifiers.

Referring to FIG. 3, an optical amplifier of the present invention having a plurality of cascaded gain sections is generally designated as 100. The amplifier 100 includes a substrate 118 of a semiconductor material having a plurality of gain sections 112 thereon. The gain sections 112 are arranged in spaced rows with the gain sections 112 in each row being spaced apart. Between each pair of adjacent gain sections 112 in each row and at each end of each row is a grating 142 which serves as either a light input or light output section. Adjacent the grating 142 at the end of each row is a totally internally reflecting corner turning mirror 141 retched into the outer surface of the device to direct light between the gratings 142 at the ends of adjacent rows. Such a mirror is described in the article of J. Puretz et al, entitled "Focused-Ion-Beam Micromachined AlGaAs Semiconductor Laser Mirrors", published in ELECTRONIC LETTERS, Vol. 22 (1986), page 700. Thus, all of the gain sections 112 are optically coupled together. Each of the gain sections 112 and each of the gratings 142 are of a construction which is the same as the gain section 12 and grating 42 of the amplifier 10 shown in FIG. 1.

In the operation of the amplifier 100, a beam of light is directed into one of the gratings 142 and is directed by the grating into the waveguide and toward an adjacent gain section 112. As described with regard to the amplifier 10 shown in FIG. 1, the light is amplified in the gain section 112 and the amplified light passes into the next grating 142. There some of the amplified light is directed out of the amplifier and some is allowed to pass into the next gain section 112 where it is again amplified. Thus, the light passes through all of the gain sections 112 where it is amplified with some of the amplified light being emitted from the amplifier at the next adjacent grating 142. This provides an emission of light from all of the gratings 142 to achieve a higher power of light output than from a single pass through amplifier 10. If desired, additional phase tuning sections, biased near optical transparency, can be added to the input or output of each amplifier in order to adjust the relative phases of the emitted light.

Figure 4:
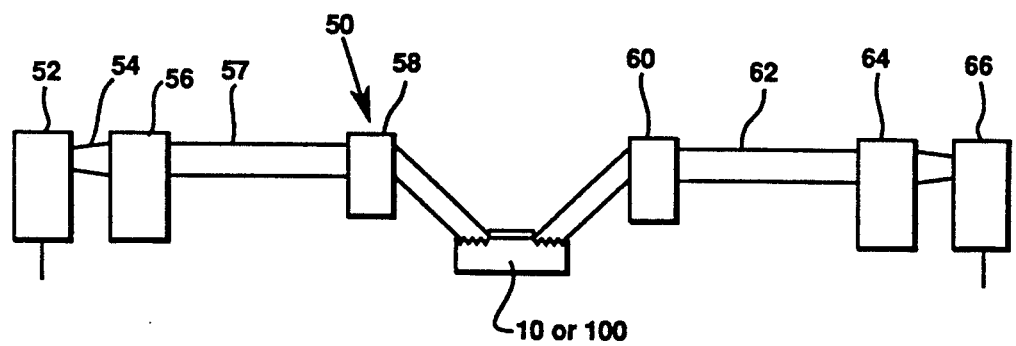
FIG. 4 is a schematic view of an optical communication system utilizing the optical amplifier of the present invention.

Referring to FIG. 4, there is shown a schematic diagram of a typical free air optical communication system 50 which utilizes the optical amplifier of the present invention. The communication system 50 includes a source 52 of a modulated optical beam 54, such as a semiconductor laser or the like. The optical beam 54 is directed into a transmitting telescope 56 which collimates the light and directs it as a beam 57 in a desired direction. In the path of the beam 57 is a receiving telescope 58 which directs the beam into an optical amplifier of the present invention. The optical amplifier may be the single pass through amplifier 10 of FIG. 1 or the multi-gain section amplifier 100 of FIG. 2. After amplification, the beam of light is emitted from the amplifier into another transmitting telescope 60 which directs the amplified beam 62 out into space in a desired direction. The amplified beam 62 is picked up by another receiving telescope 64 which directs it into an optical detector 66. The optical detector 66 converts the modulated beam of light into electrical pulses which are fed to a receiving circuit, not shown. The amplifier 10 or 100 can also be used in an optical fiber optical communication system or a hybrid optical fiber, free space communication system in which an optical fiber is coupled to the light input section and/or the light output section to direct light into and/or out of the amplifier.

Thus, there is provided by the present invention, an optical amplifier which can receive a beam of light from free space, amplify it and direct it back into free space. The amplifier can be a single pass through amplifier or can include a plurality of gain sections cascading together to achieve a greater magnitude of amplification of the light beam.

What is claimed is:

1. An optical amplifier comprising:
   a body of a semiconductor material;
   a grating on said body for receiving a beam of light and directing the beam along the path through said body;
   a gain section in said body along said path through which the beam passes, said gain section being capable of amplifying the beam; and
   a grating on said body for receiving the amplified beam of light from the gain section and directing the amplified beam out of the body;
   each of the gratings having a period such that only the first grating order of the light is coupled out of the amplifier and the second grating order is not coupled into the fundamental mode of the waveguide so that self-oscillation of the light in the waveguide does not occur so as to provide only a single pass gain.

2. An optical amplifier in accordance with claim 1 wherein the body has a waveguide therein extending along said path for guiding the beam of light through the body.

3. An optical amplifier in accordance with claim 2 wherein the gain section includes means for generating light in the waveguide when a voltage is applied across the gain section to amplify the beam of light.

4. An optical amplifier in accordance with claim 3 in which the waveguide includes an intermediate layer of a semiconductor material having a separate clad layer of a semiconductor material on each side of the intermediate layer, the clad layers are of a material which forms a heterojunction with the material of the intermediate layer and one of the clad layers is of a conductivity type opposite that of the other clad layer.

5. An optical amplifier in accordance with claim 4 in which the intermediate layer is a quantum well region.

6. An optical amplifier in accordance with claim 4 in which the intermediate layer is a multi-quantum well region.

7. An optical amplifier in accordance with claim 5 wherein the gain section includes a pair of contacts on the body at opposite sides of the intermediate layer to allow a voltage to be applied across the gain section.

8. An optical amplifier in accordance with claim 7 in which light is directed into and out of the amplifier through the surface of the body opposite that on which the grating is formed.

9. An optical waveguide in accordance with claim 1 including a plurality of gain sections in said semiconductor body and a grating across said body at each end of each gain section optically coupling said gain sections together in series.

10. An optical amplifier comprising:
    a substrate to a semiconductor material having a pair of opposed surfaces;
    a body of a semiconductor material on one of said surfaces of the substrate;
    an optical waveguide extending through said body and adapted to guide a beam of light through said body;
    a gain section in said body along said waveguide, said gain section adapted to generate light in said waveguide when a voltage is applied across the gain section so as to amplify a beam of light passing along said waveguide;
    a light input section along said waveguide at one end of said gain section, said light input section including a grating extending across said body adapted to direct a beam of light into said body and along said waveguide; and
    a light output section along said waveguide at the other end of the gain section, said light output section including a grating extending across said body adapted to direct the amplified beam of light from the gain section out of the body;
    each of said gratings having a period such that only the first grating order of the light is coupled out of the amplifier and the second grating orders are not coupled into the fundamental mode of the waveguide so that self-oscillation of the light in the waveguide does not occur so as to provide only a single pass gain.

11. An optical amplifier in accordance with claim 10 in which the waveguide includes an intermediate layer of semiconductor material having a separate clad layer of a semiconductor material on each side of the intermediate layer, the clad layers are of a material which forms a heterojunction with the material of the intermediate layer and one of the clad layer is of a conductivity type opposite that of the other clad layer.

12. An optical amplifier in accordance with claim 11 in which the intermediate layer is a quantum well region.

13. An optical amplifier in accordance with claim 11 in which the intermediate layer is a multi-quantum well region.

14. An optical amplifier in accordance with claim 11 wherein the gain section includes a pair of contacts at opposite sides of the intermediate layer to allow a voltage to be applied across the gain section.

15. An optical amplifier in accordance with claim 10 including a plurality of gain sections in said body spaced along the waveguide and a grating across said body at each end of each gain section to optically couple the gain section together in series.

16. In an optical communication system which includes means for generating a modulated beam of light and directing said beam along a path, an optical amplifier along said path for amplifying the beam of light and means for receiving the amplified beam of light and converting the beam into a modulated electrical signal, said optical amplifier comprising:

a body of a semiconductor material having an optical waveguide extending therethrough to guide the beam of light through the body;

a gain section in said body along the waveguide, said gain section being capable of generating light in the waveguide when a voltage is applied across the gain section so as to amplify the beam of light passing through the gain section;

a light input section along the waveguide at one end of the gain section, said light input section including a grating extending across said body adapted to receive the beam of light from along the path and direct it into and along the waveguide; and a light output section along the waveguide at the other end of the gain section, said light output section including a grating extending across said body adapted to direct the amplified beam of light from the gain section out of the body and along said path;

each of the gratings having a period such that only the first grating order of the light is coupled out of the amplifier and the second grating order is not coupled into the fundamental mode of the waveguide so that self-oscillation of the light in the waveguide does not occur so as to provide only a single pass gain.

17. An optical communication system in accordance with claim 16 in which the waveguide of the optical amplifier includes an intermediate layer of semiconductor material having a separate clad layer of a semiconductor material on each side of the intermediate layer, the clad layers are of a material which forms a heterojunction with the material of the intermediate layer and one of the clad layers is of a conductivity type opposite that of the other clad layer.

18. An optical communication system in accordance with claim 16 in which the intermediate layer of the waveguide is a quantum well region.

* * * * *